(12) United States Patent
Low et al.

(10) Patent No.: US 6,572,389 B2
(45) Date of Patent: Jun. 3, 2003

(54) CONTACT ELEMENTS FOR SURFACE MOUNTING OF BURN-IN SOCKET

(75) Inventors: Kok Wah Low, Bukit Mertajam (MY); Hwan Ming Wang, Penang (MY); Lin Ping Goh, Selangor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/737,212

(22) Filed: Dec. 14, 2000

(65) Prior Publication Data

US 2002/0076957 A1 Jun. 20, 2002

(51) Int. Cl.$^7$ ................................................ H01R 12/00
(52) U.S. Cl. ........................................................ 439/82
(58) Field of Search ................................ 439/82, 55, 81, 439/844, 751, 567

(56) References Cited

U.S. PATENT DOCUMENTS

| | | | | |
|---|---|---|---|---|
| 3,742,157 A | * | 6/1973 | Leposavic | 200/5 A |
| 3,777,303 A | * | 12/1973 | McDonough | 439/82 |
| 4,664,309 A | * | 5/1987 | Allen et al. | 439/66 |
| 4,950,173 A | * | 8/1990 | Minemura et al. | 439/82 |
| 4,957,453 A | * | 9/1990 | Owen | 439/422 |
| 5,152,695 A | * | 10/1992 | Grabbe et al. | 439/83 |
| 5,362,244 A | * | 11/1994 | Hanson et al. | 439/82 |
| 5,632,631 A | * | 5/1997 | Fjelstad et al. | 439/82 |
| 5,733,133 A | * | 3/1998 | Matsumura | 439/82 |
| 5,957,739 A | * | 9/1999 | Bianca et al. | 439/885 |
| 5,960,537 A | * | 10/1999 | Vicich et al. | 439/876 |
| 6,142,794 A | * | 11/2000 | Amberg | 439/82 |

\* cited by examiner

Primary Examiner—Renee Luebke
Assistant Examiner—Felix O. Figueroa
(74) Attorney, Agent, or Firm—Schwegman, Lundberg, Woessner & Kluth, P.A.

(57) ABSTRACT

A circuit board assembly having a circuit board with at least one via, a pin for insertion into the via, and a contact element positioned adjacent to the pin and the via for providing electrical attachment of the pin to the via of the circuit board. The pin is detachable from the via and the contact element deforms upon insertion of the pin.

20 Claims, 8 Drawing Sheets

CONTACT ELEMENTS FOR SURFACE MOUNTING OF BURN-IN SOCKET

BACKGROUND OF THE INVENTION

The present invention concerns socket mounts, particularly printed circuit board contact elements used to mount electrical device-containing sockets to the circuit boards.

Burn-in sockets are generally soldered to the printed circuit boards. The solder electrically and mechanically secures the socket to the printed circuit board.

Burn-in is a semiconductor industry manufacturing process for screening out non-functional chips or devices. The chip is inserted into a socket (commonly referred to as a burn-in socket), this socket holds the chip in place while providing electrical continuity from the chip to a printed circuit board (PCB).

The burn-in socket (BIS) comes with contact pins. The length of the contact pin that protrudes from the bottom of the socket into the PCB for soldering is called a solder-tail. When a socket is de-soldered from a PCB, solder remnants are left on the solder-tail. These solder remnants increase the diameter of the contact pin making it difficult to reuse the socket by inserting the increased diameter contact pin in a new board.

There are at least three problems associated with soldering sockets to the printed circuit board. First, in order to remove the socket, the solder must be reheated. The reheating process may damage the socket reducing its reliability when reused. In addition, the reheating process is difficult to limit to the area of the socket to be removed, affecting adjacent sockets. Second, soldering may cause thermal stress which may lead to plastic deformation. Third, desoldering may cause solder bridging of solder remnants on the socket solder-tails. Solder remnants on the solder-tail also reduces the reliability if the socket is replaced.

The number of contact pins per socket can range from as few as 10 contact pins to 1500 or more contact pins. It is critical for the contact pins to remain straight so that they align with the holes in the PCB. After the burn-in socket is removed from the PCB, the contact pins may become bent or misaligned due to reheating or solder remnants on the socket solder-tail. Lastly, the cost of wave soldering equipment is high and processing lead times to replace a socket may be long.

Thus, there is a need for a socket mount that provides secure electrical connectivity between sockets and printed circuit boards without damage caused to the socket and adjacent sockets by reheating of solder socket connections. There is also a need for a simplified mounting and removal process for sockets that reduces the long lead times encountered with soldering operations.

BRIEF DESCRIPTION OF THE DRAWINGS

FIG. 1 depicts a socket mounted to the circuit board with its pins received in contact elements configured in conformance with the principles of the present invention and FIG. 2 depicts a socket not yet mounted to a circuit board.

DETAILED DESCRIPTION

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

To address these needs, one exemplary embodiment of a printed circuit board assembly includes a printed circuit board, a socket having a pin, and a contact element securing the pin to the printed circuit board.

Advantageously, the socket may be removed without damaging the socket or adjacent sockets. The socket is removably secured to the printed circuit board without the use of solder.

Figure 1:
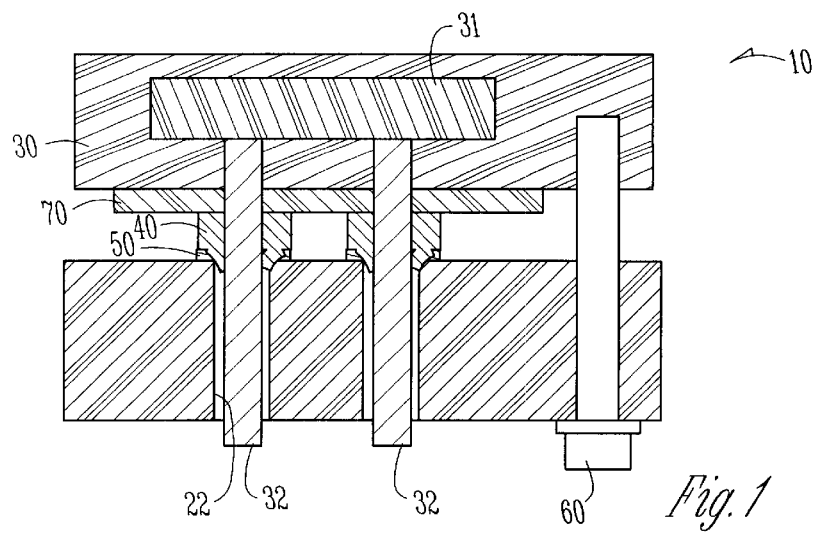
FIGS. 1 and 2 are side views of one embodiment of a printed circuit board assembly depicting two sockets.

FIG. 1 shows an exemplary circuit board assembly 10. The assembly 10 includes a circuit board 20 having at least one via 22. The circuit board 20 will ultimately be electrically connected to a device or chip 31 under test held in a burn-in socket 30 with at least one pin 32 carried by the socket 30. A contact element 40 provides electrical continuity between the pin 32 of the burn-in socket 30 and the via 22 of the circuit board 20. Solder paste 50, is optionally used to improve the electrical connection between the contact 40 and the circuit board 20.

Figure 2:
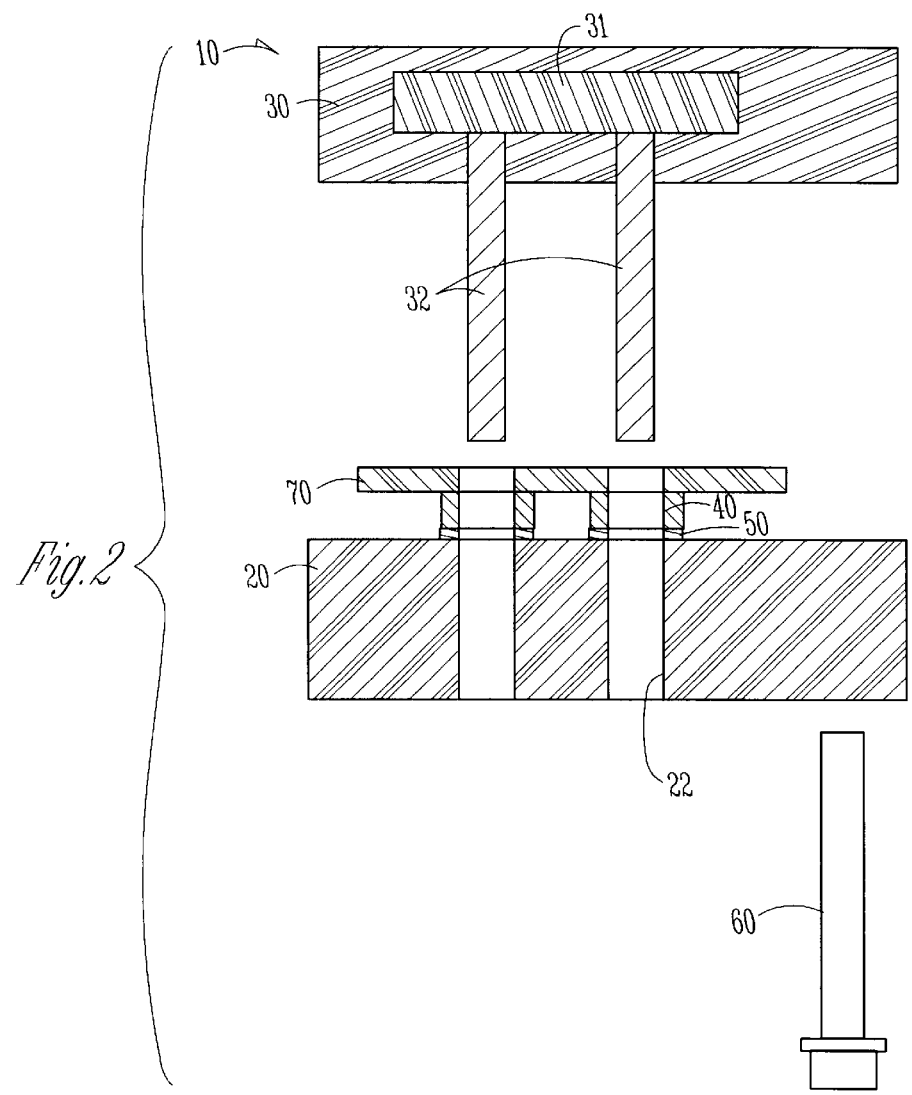

FIG. 2 shows circuit board assembly 10 with the pins 32 of the burn-in socket 30 disconnected from the circuit board 20.

A number of contact elements 40 are inserted or attached to each via 22 of circuit board 20 to mate with a pin grid array of pins 32 of the burn-in socket 30. Burn-in socket 30 is attachable to and removable from the circuit board 20 without subjecting the circuit board assembly 10 to wave soldering. No soldering is required to secure electrical connectivity between the socket pins and the burn-in socket, as will be described in detail below. Mounting and removal processes of the burn-in socket are simplified. No heat is needed to remove the burn-in socket from the circuit board. The burn-in socket 30 is also secured to the circuit board 20 by using fasteners 60. The burn-in sockets 30 may be used in conjunction with another circuit board. Since no soldering equipment is necessary, shorter replacement times are possible. In addition, individual, damaged, or defective burn-in sockets are easily replaceable without affecting adjacent areas of the circuit board 20.

Figure 3:
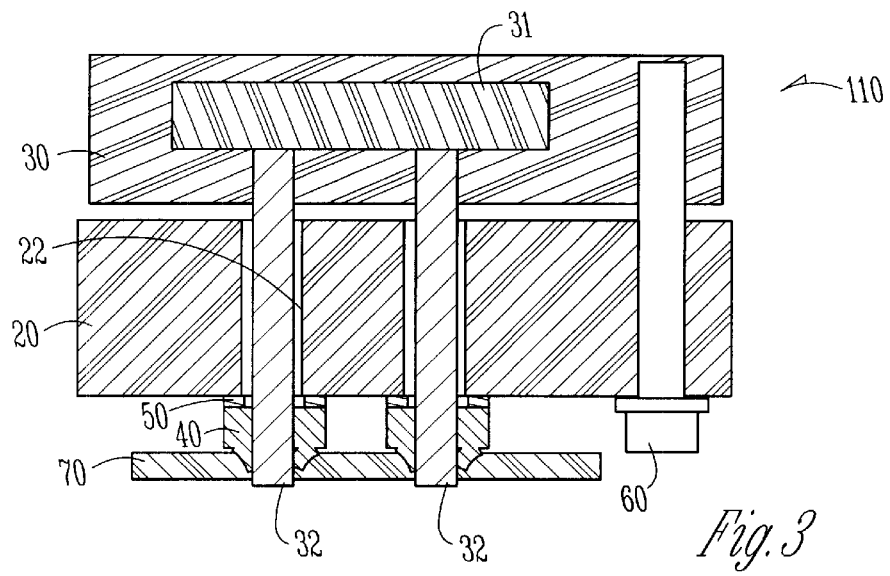
FIG. 3 is a side view of one embodiment of a printed circuit board assembly depicting mounting the contact elements on the bottom side of the printed circuit board instead of between the printed circuit board and the socket as shown in FIGS. 1 and 2.

FIG. 3 shows another embodiment of circuit board assembly 110 with the contact element 40 located beneath the printed circuit board 20 instead of between the printed circuit board and the burn-in socket as shown in FIGS. 1 and 2. Optionally, a contact element sheet 70 positions the contact elements 40 for receiving the pins 32. The contact element sheet 70 is a high temperature resistant adhesive sheet, for example, but not limited to KAPTON™ tape, for securing the contacts 40 in position.

Figure 4:
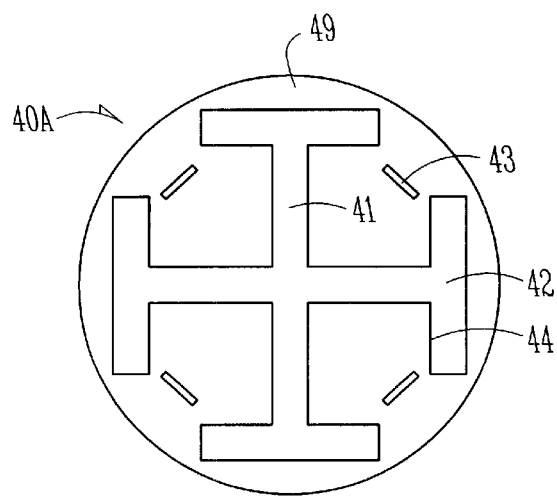
FIG. 4 is a magnified top view of one embodiment of a contact element.
Figure 5:
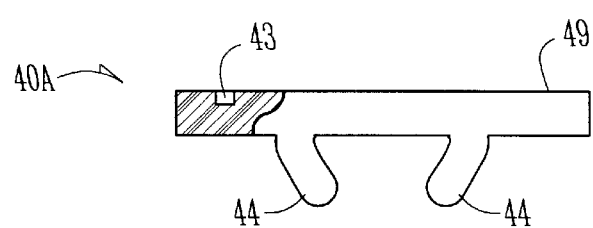
FIG. 5 is a side view of the contact element of FIG. 4.

Referring to FIGS. 4 and 5, contact element 40a is a disk 49 with large cuts 41, small cuts 42, and grooves 43 formed in the disk 49 to provide an opening for a contact pin to pass through. The disk 49 may be formed from a plated metal sheet 80 as further described in FIG. 6. The disk 49 is shown as but not limited to a circular shape, other shapes such as square or rectangular for example may also be used. Four large cuts 41 meet at the center of the disc 49, forming a cross. A small cut 42 is located at each end of the cross, forming a T shape out of each of four legs of the cross. The base of each of the T shapes meet at the center of the disk 49 and forms four fingers 44. Optionally, grooves 43 are formed at the point where the fingers 44 connect to the circular disk 49 between the top outer ends of each of the T shapes. Grooves 43 are channels formed in one side of the disk 49 that do not pass all the way through the disk 49. The grooves 43 reduce the force needed to deflect fingers 44 as the pin is inserted through the contact element 40a.

Figure 6:
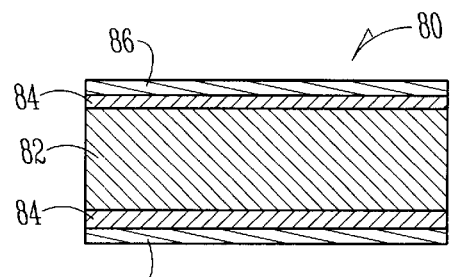
FIG. 6 is a magnified cross sectional side view of plating layers of one embodiment of a contact element.

As shown in FIG. 6, the plated metal sheet 80 is comprised of, but not limited to a base 82 of Beryllium Copper (BeCu) with inside layers 84 of nickel (Ni) and outside layers 86 of gold (Au).

Figures 7, 8:
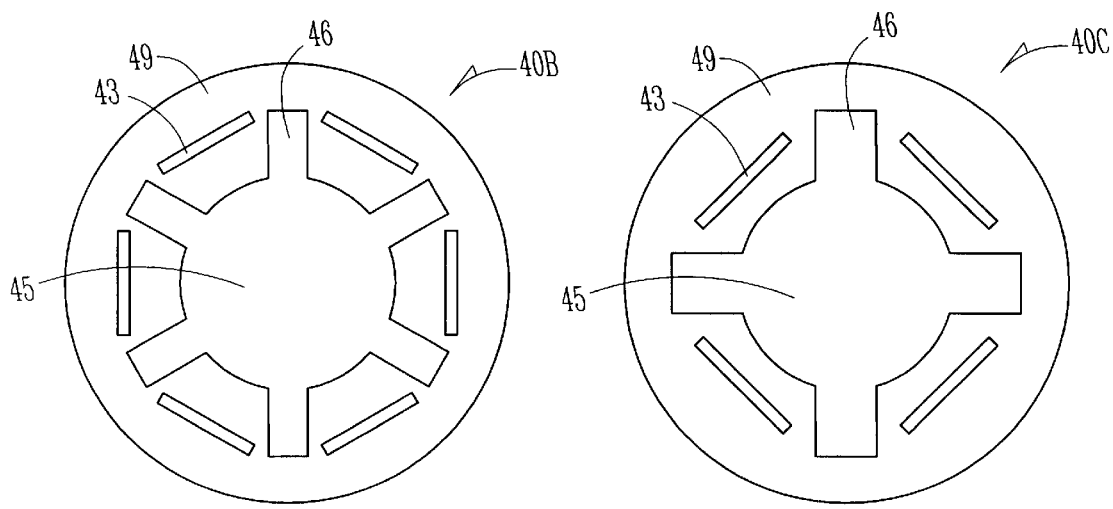
FIG. 7 is a magnified top view of another embodiment of a contact element.
FIG. 8 is a magnified top view of another embodiment of a contact element.

FIGS. 7 and 8 show additional embodiments of a contact element 40. FIG. 7 depicts contact element 40b formed from a disk 49 with a round cut 45 and a plurality of extension cuts 46 formed in a circular shaped disk. Optionally, grooves 43 are formed in the disk 49 between the extension cuts 46. FIG. 8 depicts contact element 40c formed from a disk 49 with a round cut 45 and a plurality of extension cuts 46 formed in the circular shaped disk. Optionally, grooves 43 are formed in the disk 49 between the extension cuts 46.

Figure 9:
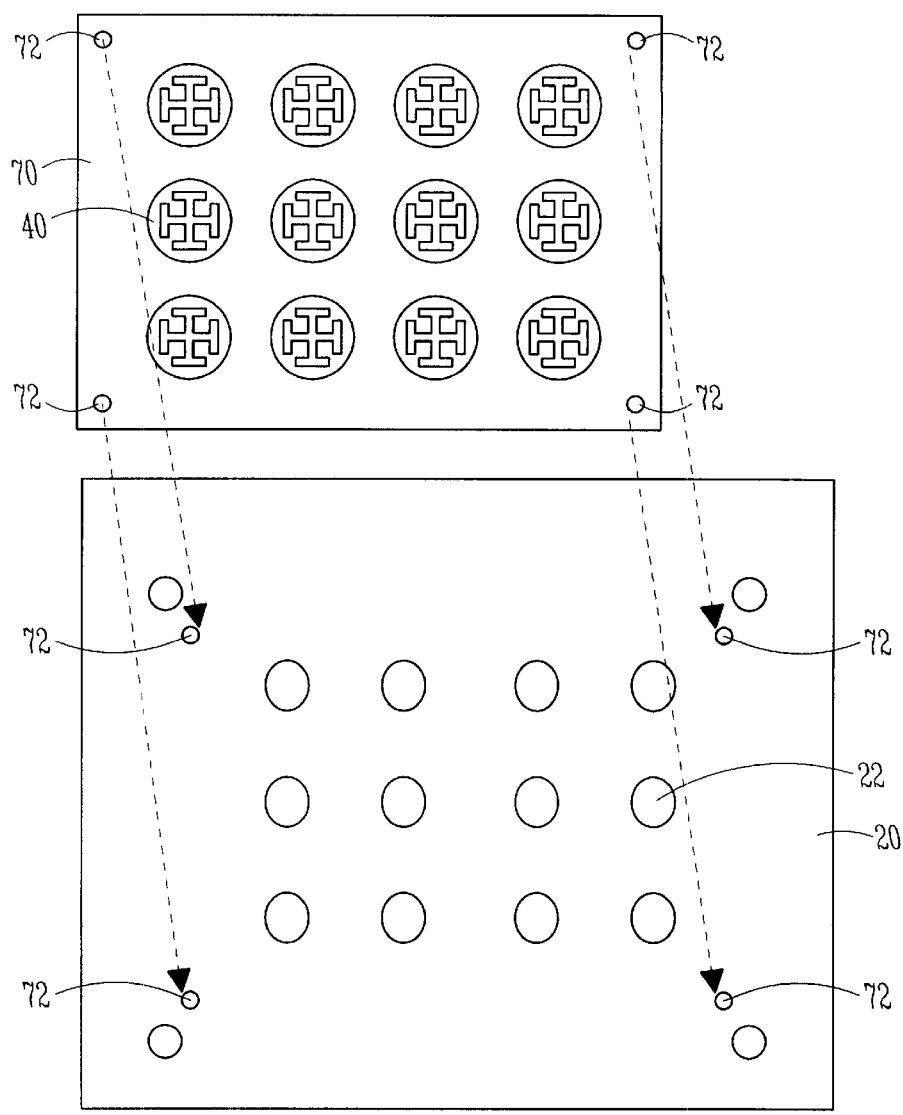
FIG. 9 is an exploded perspective view of a contact element sheet and a circuit board depicting alignment of the contact elements with vias of the circuit board.

As shown in FIG. 9, a circuit board 20 with an array of vias 22 aligns with a contact element sheet 70 with an array of contact elements 40. The vias 22 and contact elements 40 are aligned using alignment pin holes 72 in the circuit board 20 that match with alignment pin holes 72 in the contact element sheet 70.

Figure 10:
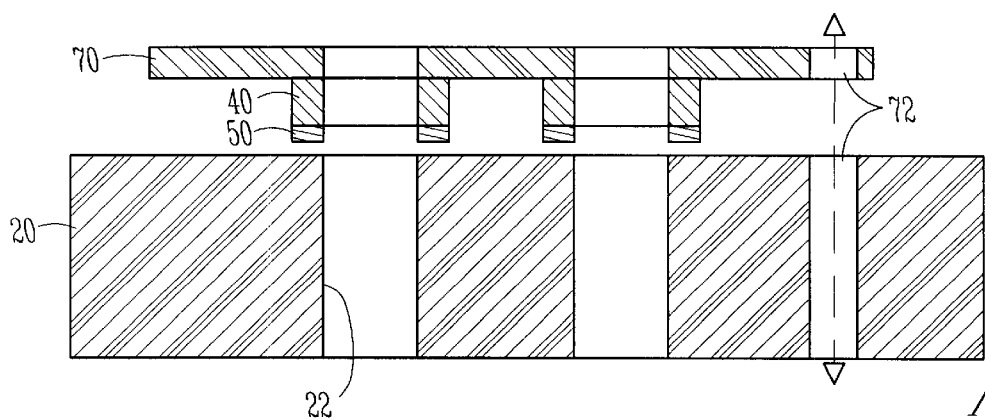
FIG. 10 is a side view of the circuit board and contact element sheet depicting alignment of the alignment pin holes of the contact element sheet and the alignment pin holes of the circuit board.

As shown in FIG. 10, a cross sectional view of the contact element sheet 70 and contact elements 40 positioned adjacent to and aligned with the circuit board 20 using the alignment pin holes 72. Optionally, solder paste 50 is positioned on the contact elements 40, however, the solder paste 50 may also be placed on the circuit board 20 prior to positioning the contact elements 40 on the circuit board 20.

Figure 11:
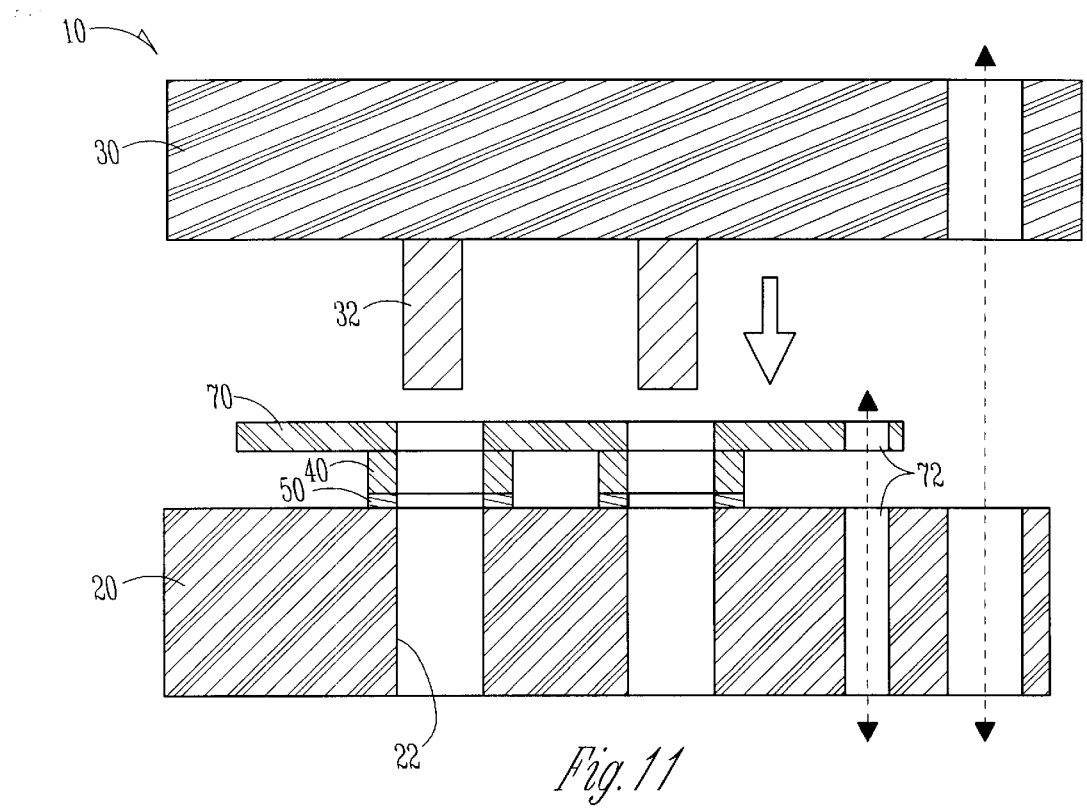
FIG. 11 is a side view of the circuit board assembly depicting alignment of the circuit board and the contact element sheet, and alignment of the circuit board and the socket.

FIG. 11 shows the circuit board assembly 10 aligned for assembly. The alignment pin holes 72 of the contact element sheet 70 align with the alignment pin holes 72 of the circuit board 20. The socket pins 32 align with the vias 22 in the circuit board 20.

Figure 12:
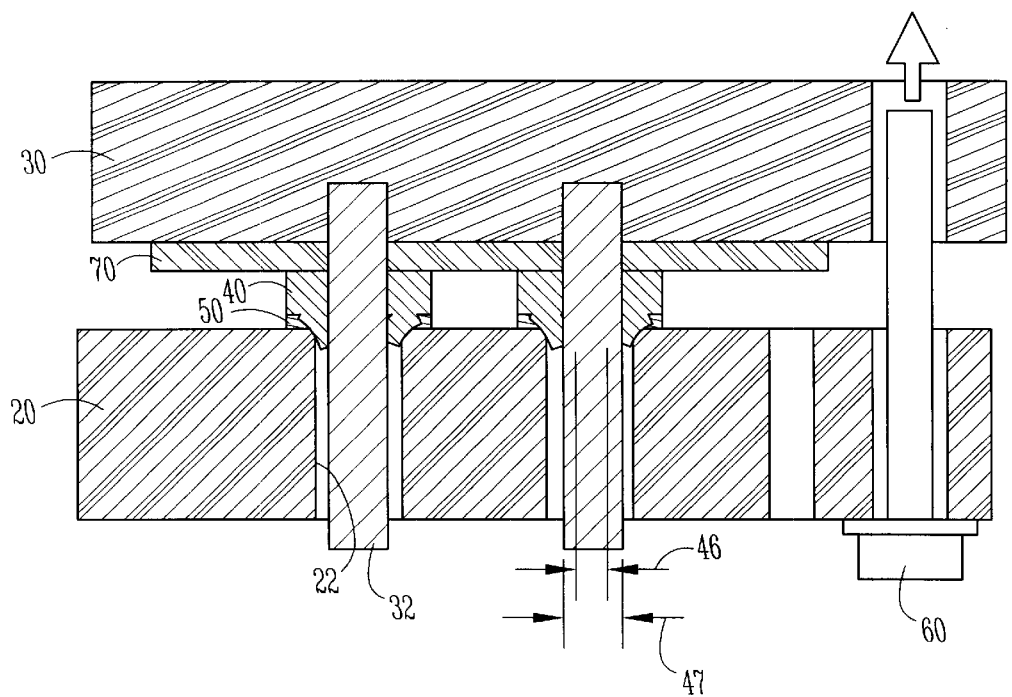
FIG. 12 is a side view of an embodiment of an assembled circuit board assembly.

FIG. 12 shows an assembled circuit board assembly 10. The pins 32 are inserted in the vias 22 and the fingers 44 of the contact elements 40 are displaced to allow passage of the pin 32 through the contact element 40. The contact element 40 provides electrical and mechanical continuity between the pins 32 and the via 22 of the circuit board 20. The fingers 44 are forced open as the pin 32 is inserted. The spring effect or resiliency of the contact element 40 provides frictional contact and electrical contact between the contact element 40 and pin 32. The fingers 44 may assume a first inside diameter 46 and a second inside diameter 47. The first inside diameter 46 of the fingers 44 is less than the diameter of the pin 32. The second inside diameter 47 of the fingers 44 is substantially equal to the diameter of the pin 32. The socket 30 is secured to the circuit board 20 with a fastener 60.

The circuit board assembly 10 includes a circuit board 20 having at least one via 22. The circuit board 20 electrically connects to a burn-in socket 30 with at least one pin 32. A contact element 40 provides electrical continuity between the pin 32 of the burn-in socket 30 and the via 22 of the circuit board 20. Optionally, a number of contact elements 40 are inserted or attached to each via 22 of circuit board 20 to mate with a pin grid array of pins 32 of the burn-in socket 30. Burn-in socket 30 is attachable and removable from the circuit board 20 without subjecting the circuit board assembly 10 to wave soldering. No soldering is required to secure electrical connectivity between the socket pins 32 and the circuit board 20. Mounting and removal processes of the burn-in socket 30 are simplified. No heat is needed to remove the burn-in socket 30. The burn-in socket 30 may also be secured to the circuit board 20 by using at least one fastener 60. The burn-in socket 30 may be used on another circuit board with a new set of contact elements. Since no soldering equipment is necessary, shorter replacement times are possible. In addition, individual, damaged, or defective burn-in sockets are easily replaceable without affecting adjacent areas of the circuit board 20.

Figure 13:
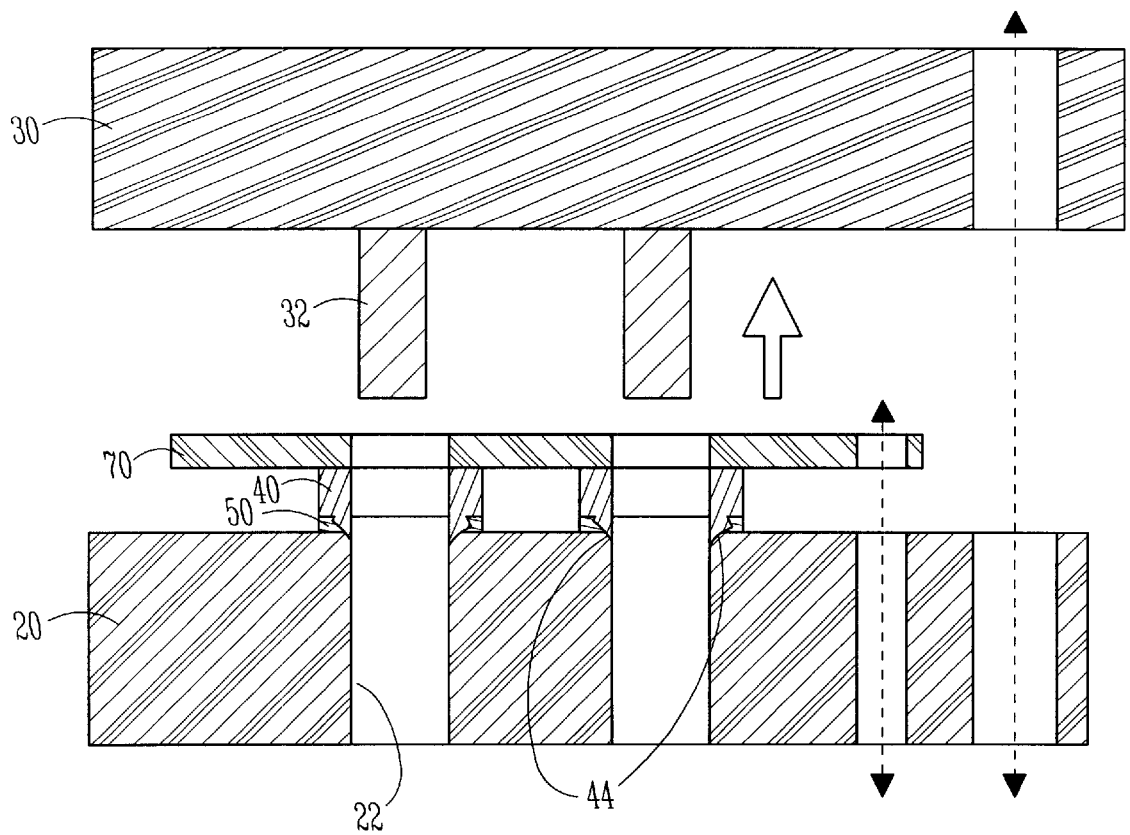
FIG. 13 is a side view of one embodiment of a disassembled circuit board assembly depicting used contact elements.
Figure 14:
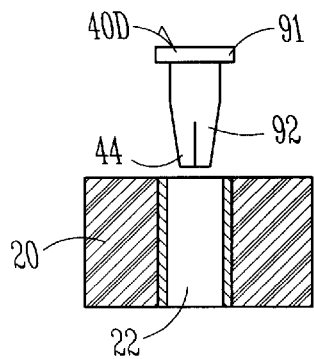
FIGS. 14 and 15 are magnified side views showing the insertion of another embodiment of a contact element into the via of the circuit board.
Figure 15:
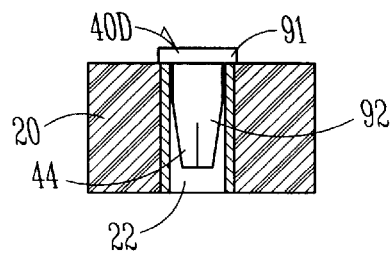

FIG. 13 shows the circuit board assembly 10 disassembled. The socket 30 may be removed from the circuit board 20 without heating the circuit board 20 or the use of wave solder equipment. The fastener 60 is removed and the socket 30 is released from circuit board 20. The contact elements 40 deform to release the pins 32 from the contact elements 40.

As shown in FIGS. 14–17, another embodiment of contact element 40D is press fit into the via 22 of the circuit board 20. The outside diameter of the contact element 40D is substantially equal to the diameter of the via 22 so that the contact element 40D is press fit into the via 22. Press fitting the contact element 40D into the via 22 provides electrical and mechanical contact between the via 22 and the contact element 40D.

Figure 16:
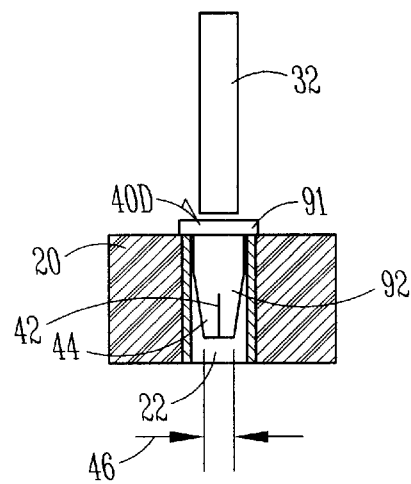
FIGS. 16 and 17 are magnified side views of the inserted contact element of FIGS. 14 and 15 receiving a socket pin.

As shown in FIG. 16, pin 32 is inserted through contact element 40D forcing the fingers 44 of contact element 40D to spread apart. The spring effect or resiliency of the contact element 40D provides frictional contact and electrical contact between the contact element 40D and pin 32.

Figure 17:
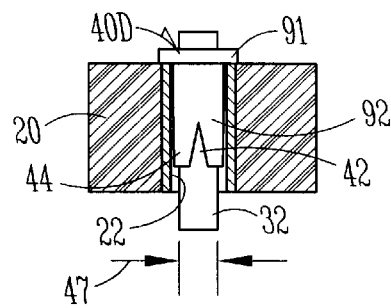

The plurality of fingers 44 have a first inside diameter 46 as shown in FIG. 16 and a second inside diameter 47 as shown in FIG. 17. The first inside diameter 46 of the plurality of fingers 44 is less than the diameter of the pin 32. The second inside diameter 47 of the plurality of fingers 44 is substantially equal to the diameter of the pin 32.

As shown in FIGS. 14–17, the contact element 40D includes a lip portion 91 and a tapered portion 92. The lip portion 91 has an outside diameter greater than an inside diameter of a via 22 and an opening greater than the outside diameter of a pin 32. The tapered portion 92 has an outside diameter less than the inside diameter of the via 22 and a first inside diameter 46 less than the outside diameter of the pin 32. The tapered portion 92 is deformable, such that upon insertion of the pin 32, the tapered portion 92 is deflectable to a second inside diameter 47 substantially equal to the outside diameter of the pin 32.

Figure 18:
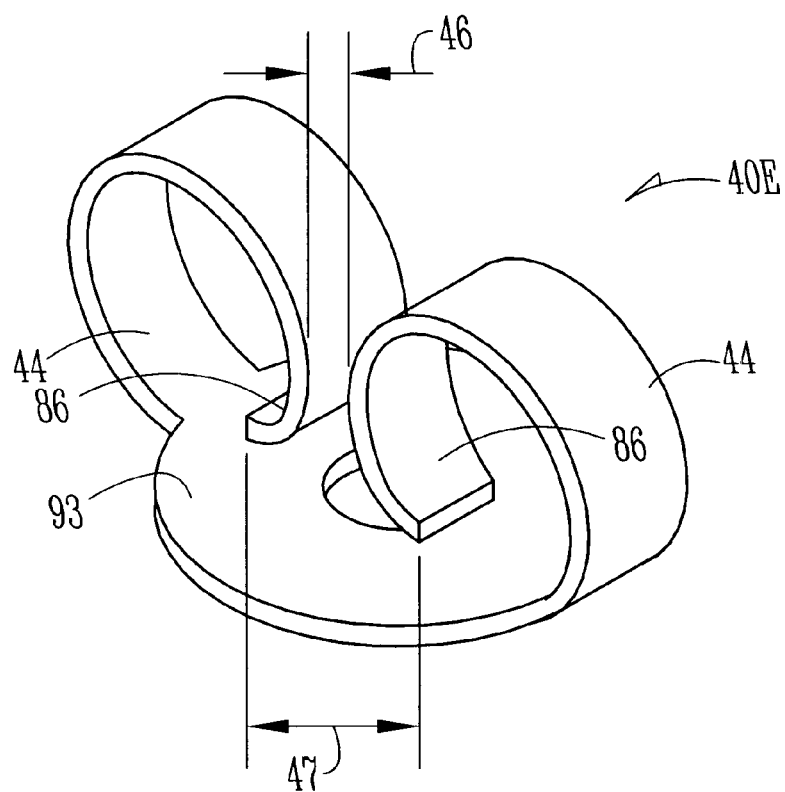
FIG. 18 is a perspective view of another embodiment of a contact element.

An additional embodiment of contact element 40 is shown in FIG. 18. It shows contact element 40E with a plurality of fingers 44. These fingers 44 are inwardly extending fingers 100. The plurality of fingers 44 deflect to provide a first inside diameter 46 and a second inside diameter 47. The first inside diameter 46 of the plurality of fingers is less than the diameter of the pin 32. The second inside diameter 47 of the plurality of fingers 44 is substantially equal to the diameter of the pin 32. The spring effect or resiliency of the contact element 40E provides frictional contact and electrical contact between the contact element 40E and pin 32.

As shown in FIG. 18, the contact element 40E includes a base portion 93 formed as a disk and a plurality of fingers 44. The base portion 93 has an outside diameter greater than the inside diameter of the via 22 and the base portion 93 has an opening greater than the outside diameter of the pin 32. The plurality of fingers 44 form a first inside diameter 46 less than the outside diameter of a pin 32. The plurality of fingers 44 are deformable, such that upon insertion of the pin 32, the plurality of fingers 44 are deflectable to a second inside diameter 47 substantially equal to the outside diameter of the pin 32.

Alternatively, the contact element can be attached to the via by infrared reflow.

An exemplary method of securing a pin to a via in a circuit board includes placing a contact element adjacent to the via, inserting the pin through the contact element, deforming the contact element, and providing an electrical and mechanical connection between the pin and the via with the contact element. Alternatively, the contact element can be attached to the via by infrared reflow. Optionally, the method includes removing the pin from the via without heating the pin and via.

Advantageously, the circuit board assembly provides a contact element that allows the socket to be removed from the printed circuit board without damaging the socket, adjacent sockets, or the printed circuit board. The socket is removably secured to the printed circuit board with a replaceable contact element without the use of solder.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A contact element, comprising:
   a disk;
   a plurality of cuts formed in the disk and defining a plurality of fingers connected to the disk; and
   a plurality of grooves formed in the disk as channels which do not pass completely through the disk, wherein each one of the plurality of grooves is formed in the disk at a point where each one of the plurality of fingers is connected to the disk.

2. The contact element of claim 1, wherein each one of the plurality of fingers resiliently deform from assuming a first diameter to assuming a second diameter when a pin is inserted between the plurality of fingers.

3. The contact element of claim 1, wherein the plurality of cuts includes a round cut and at least four extension cuts.

4. The contact element of claim 1, wherein the plurality of cuts includes a round cut and at least six extension cuts.

5. The contact element of claim 1, wherein the plurality of cuts includes at least two T-shaped cuts.

6. The contact element of claim 1, wherein the disk includes a lip portion having an outside diameter greater than an inside diameter of a via into which the contact element is inserted, and wherein the disk has an opening having an inside diameter greater than an outside diameter of a pin which is inserted between the plurality of fingers.

7. The contact element of claim 1, wherein the disk includes a tapered portion having an outside diameter less than an inside diameter of a via into which the contact element is inserted, and a first inside diameter less than an outside diameter of a pin which is inserted between the plurality of fingers.

8. The contact element of claim 7, wherein the tapered portion is deformable upon insertion of the pin, and deflectable to a second inside diameter substantially equal to an outside diameter of the pin.

9. An assembly, comprising:
   a circuit board having a via; and
   a contact element attached to the via, wherein the contact element includes a disk, a plurality of cuts formed in the disk and defining a plurality of fingers connected to the disk, and a plurality of grooves formed in the disk as channels which do not pass completely through the disk, wherein each one of the plurality of grooves is formed in the disk at a point where each one of the plurality of fingers is connected to the disk.

10. The assembly of claim 9, wherein the contact element is press fit into the via.

11. The assembly of claim 9, further comprising:
    a contact element sheet attached to the contact element, wherein the contact element sheet is a high temperature resistant adhesive sheet.

12. The assembly of claim 9, further comprising:
    a socket including a pin capable of being inserted between the plurality of fingers and causing the plurality of fingers to resiliently deform from assuming a first diameter to assuming a second diameter.

13. The assembly of claim 12, wherein the circuit board has a first side and a second side, wherein the contact element is attached to the first side, and wherein the pin is inserted from the second side.

14. A method, comprising:
    inserting a pin between a plurality of fingers attached to a contact element, the contact element including a disk, a plurality of cuts formed in the disk to define the plurality of fingers, and a plurality of grooves formed in the disk as channels which do not pass completely through the disk, wherein each one of the plurality of grooves is formed in the disk at a point where each one of the plurality of fingers is connected to the disk; and
    deforming the plurality of fingers from a first inside diameter less than an outside diameter of the pin to assume a second inside diameter substantially equal to the outside diameter of the pin.

15. The method of claim 14, further comprising:

placing the contact element adjacent to a via included in a circuit board.

16. The method of claim 14, further comprising:

placing the contact element adjacent to an adhesive contact element sheet; and placing a circuit board adjacent to the contact element.

17. The method of claim 14, further comprising:

attaching the contact element to a circuit board using infra-red reflow.

18. A method, comprising:

forming a disk from a sheet of plated metal;

forming a plurality of cuts in the disk to define a plurality of fingers connected to the disk; and forming a plurality of grooves in the disk as channels which do not pass completely through the disk, wherein each one of the plurality of grooves is formed in the disk at a point where each one of the plurality of fingers is connected to the disk.

19. The method of claim 18, wherein forming the plurality of cuts in the disk to define the plurality of fingers connected to the disk further comprises:

forming the plurality of cuts as a round cut and a plurality of extension cuts.

20. The method of claim 18, wherein forming the plurality of cuts in the disk to define the plurality of fingers connected to the disk further comprises:

forming the plurality of cuts as a plurality of T-shaped cuts.

* * * * *